(12) United States Patent
Nielsen et al.

(10) Patent No.: US 8,361,699 B2
(45) Date of Patent: Jan. 29, 2013

(54) METHOD FOR PERFORMING ELECTRON BEAM LITHOGRAPHY

(75) Inventors: Theodor Kamp Nielsen, Copenhagen (DK); Brian Bilenberg, Ølstykke (DK); Peixiong Shi, Lyngby (DK)

(73) Assignee: Nil Technology APS, Kgs. Lyngby (DK)

( * ) Notice: Subject to any disclaimer, the term of this patent is extended or adjusted under 35 U.S.C. 154(b) by 214 days.

(21) Appl. No.: 12/866,070

(22) PCT Filed: Feb. 5, 2009

(86) PCT No.: PCT/DK2009/050036
§ 371 (c)(1),
(2), (4) Date: Nov. 19, 2010

(87) PCT Pub. No.: WO2009/097859
PCT Pub. Date: Aug. 13, 2009

(65) Prior Publication Data
US 2011/0053087 A1     Mar. 3, 2011

(30) Foreign Application Priority Data

Feb. 5, 2008 (DK) ................................ 2008 00161

(51) Int. Cl.
*G03C 5/00* (2006.01)

(52) U.S. Cl. ......... 430/296; 430/328; 430/394; 430/942

(58) Field of Classification Search ................ 430/296, 430/328, 394, 942
See application file for complete search history.

(56) References Cited

U.S. PATENT DOCUMENTS

| 5,369,282 | A | 11/1994 | Arai et al. |
| 5,759,744 | A | 6/1998 | Brueck et al. |
| 6,238,850 | B1 | 5/2001 | Bula et al. |
| 2003/0155532 | A1 | 8/2003 | De Jager et al. |

FOREIGN PATENT DOCUMENTS

| EP | 0 964 305 A1 | 12/1999 |
| WO | WO 2006/076740 A2 | 7/2006 |

OTHER PUBLICATIONS

Yi-Pin Fang et al., "A Simple Method to Fabricate Single Electron Devices", Phys. Condens. Matter 14, R995 (2002) pp. 83-86.
International Search Report PCT/DK2008/00161 dated Oct. 15, 2008.

*Primary Examiner* — Christopher Young
(74) *Attorney, Agent, or Firm* — Foley & Lardner LLP

(57) ABSTRACT

The present invention relates to a method for performing high speed electron beam lithography (EBL). An electron beam source (EBS), capable of emitting an electron beam towards the energy sensitive resist, forms a first pattern (P1) on the substrate, the first pattern defining a first direction (D1) on the substrate. The electron beam source then forms a second pattern (P2) on the substrate. The energy and/or dose delivered to the energy sensitive resist during the exposure of the first and the second pattern is dimensioned so that the threshold dose/energy of the energy sensitive resist is reached on the overlapping portions of the first and the second patterns (P1, P2). The invention provides a high speed technique for the production of substrates with high quality developed patterns, e.g. hole or dot arrays, by electron beam lithography. Each hole or dot may be defined by the mutually overlapping portions of the first and second pattern, e.g. exposed lines forming a grid, instead of addressing each dot or hole separately.

12 Claims, 11 Drawing Sheets

Exposure trace

Exposure trace

METHOD FOR PERFORMING ELECTRON BEAM LITHOGRAPHY

CROSS-REFERENCE TO RELATED APPLICATIONS

This application is the U.S. national phase of PCT/DK2009/050036 filed Feb. 5, 2009; which claims priority from Danish Application No. PA 2008 00161 filed Feb. 5, 2008. The subject matter of each of the above-referenced applications is incorporated in entirety by reference.

FIELD OF THE INVENTION

The present invention relates to a method for performing electron beam lithography. The invention also relates to a corresponding computer program product.

BACKGROUND OF THE INVENTION

Electron-beam lithography has developed after the limit was reached in optical lithography as regards the smallest spot that could reasonably be formed by optical means. Electron-beam lithography makes it possible to record significantly smaller pits/grooves on an energy sensitive resist on a wafer for optical or electronic applications.

US2003155532 discloses a device for electron-beam lithography wherein very small pits can be written, using a small beam intensity, by exposing each pit several times during writing thereby avoiding the mutual repulsion between the electrons setting an upper limit for electron density in the beams. A row of electron beams is arranged in the longitudinal direction of the track. Each beam from the row of beams can be controlled, either to be projected onto the track via electron optics, or to be scattered to an electron absorbing position. The control of the row of beams ensures that each time a track position to be exposed passes the projection position of a beam from said row of beams, the beam in question is projected onto the position in question. Furthermore, means are provided for shifting the beams from the row of beams in transverse direction on the track for the purpose of writing a second track simultaneously with the main track. Finally, several rows of beams arranged one beside another for simultaneously writing onto two tracks arranged one beside another are described. By this device one and the same spot on the master disk can be "exposed" to an electron beam from the row of beams a number of times, wherein successive electron beams from said row of beams are used for successive exposures. The controllable means make it possible either to direct a beam from said row of beams through the aperture, similarly to the process of "exposing" the resist on the master disk, or not to direct said beam through the aperture, similarly to the process of "not exposing" the resist on the master disk. In this manner it is ensured that a very short "exposure time" is used for each exposure of the resist to a beam of electrons, whilst a sufficiently long overall "exposure time", in particular sufficiently long for minimizing the amount of noise in the signal, can be achieved by selecting a sufficiently large number of beams in the row of beams. However, the electron beam lithography method of US2003155532 is used for manufacturing tracks for optical master disks.

WO 2006076740 discloses a related multi-beam synchronous raster scanning lithography system that includes a processor which generates electrical signals representing a desired exposure pattern at an output. A multi-beam source of exposing radiation generates a plurality of exposure beams. A beam modulator receives the electrical signals generated by the processor and modulates the plurality of exposing beams according to the desired exposure pattern. A beam deflector deflects the plurality of exposure beams by a predetermined distance along a first axis, thereby exposing a plurality of pixels along the first axis with the desired exposure pattern. A translation stage moves the substrate a predetermined distance along a second axis to position the substrate for a subsequent exposure of pixels along the first axis that results in a desired overlapping exposure dose profile. In order to accurately control the exposure pattern formed, this lithography system requires that the beam (optical or electron) is energised and de-energised in time, i.e. the beam is turned on and off. This necessitates quite precise knowledge or feedback about the actual position of the beam, which, in turn, sets a limit to the scanning speed of the lithography system. Thus, a faster lithography system is desired.

When producing wafers or substrates with hole or dot arrays today by electron beam lithography, each individual hole and/or dot (element) is addressed separately. Each dot is down to sub-10 nm in diameter, and the registration accuracy of each hole or dot has to be less than 1 nm. This makes it very critical to move the beam accurately and a finite time is spent on each movement making it impossible to decrease the necessary exposure time below a certain limit for any given electron beam lithography system.

Hence, an improved method for performing electron beam lithography (EBL) would be advantageous, and in particular a more efficient and/or reliable method would be advantageous.

SUMMARY OF THE INVENTION

Accordingly, the invention preferably seeks to mitigate, alleviate or eliminate one or more of the above mentioned disadvantages singly or in any combination. In particular, it may be seen as an object of the present invention to provide an improved method for performing electron beam lithography (EBL) that solves the above-mentioned problems of the prior art with producing patterns with a nanometer-scale precision in a sufficient time.

This object and several other objects are obtained in a first aspect of the invention by providing a method for performing electron beam lithography (EBL), the method comprising:

providing a substrate with an energy sensitive resist with a threshold dose/energy on a surface of the substrate, providing an electron beam source (EBS) capable of emitting an electron beam towards the energy sensitive resist, relatively displacing the electron beam across the substrate a first plurality of times so as to form a first pattern (P1) on the substrate, the first pattern defining a first direction (D1) on the substrate, and relatively displacing the electron beam across the substrate a second plurality of times so as to form a second pattern (P2) on the substrate, the second pattern defining a second direction (D2) on the substrate, the second direction (D2) being non-parallel to the first direction (D1), wherein the energy and/or dose delivered to the energy sensitive resist during the exposure of the first and the second pattern is dimensioned so that the said threshold dose/energy of the energy sensitive resist is reached on the overlapping portions of the first and the second patterns (P1, P2), and wherein the electron beam during passage of an overlapping portion of the first and the second patterns (P1, P2) has a substantially unchanged beam intensity and/or energy, as compared to the beam intensity and/or the energy of the electron beam immediately before the said passage.

The invention is particularly, but not exclusively, advantageous for obtaining a high speed technique for the production of substrates with high quality developed patterns e.g. hole or dot arrays by electron beam lithography. Each hole or dot may be defined by the mutually overlapping portions of the first and second pattern, e.g. exposed lines forming a grid, instead of addressing each dot or hole separately. This way the time used addressing each element during exposure is minimized making it a very fast way to fabricate substrates with high quality hole or dot arrays.

The present invention enables high speed (cheap) production of high quality hole or dot arrays by electron beam lithography. The strength of the invention is that it lowers the exposure time of uniform hole or dot arrays significantly. For a square hole or dot array with 100 nm period the writing strategy of the present invention will lower the time spent on addressing elements with a factor of more than 10,000 for a 1 cm×1 cm patterned area.

The present invention has the additional advantage that the invention may be implemented relatively straightforward because only minor modifications of current known electron beam lithography devices are needed, and these modifications are only related to the writing strategy.

By the threshold dose/energy is meant the dose/energy necessary to fully expose (meaning supply energy to the resist) the resist so that it will either be removed (positive resist) or stay (negative resist) on the substrate after development. This is also known as the clearing dose or saturation dose/energy of the resist at a given electron energy.

The present invention may be applied where high accuracy of electron beam lithography and also high manufacturing speed is required. A potential application could be the production of the following applications and/or products and/or production of NIL stamps used in the following applications and/or products:

LEDs
Integrated optics (including photonic band gap structures)
Surface energy engineering
Surface bio compatibility engineering
Cooling
Heat transfer
Automotive
Active and passive optical elements
Displays
Storage (including hard disc and optical)
MEMS
NEMS
Antireflection
Solar cells
Photo Voltaic elements
Batteries
Filter (particle filters, bio filters, water filters, etc.)
TEM Windows
Quantum devices, and
SERS (Surface Enhanced Raman Spectroscopy)

In the context of the present invention, it is to be understood that the term "substantially unchanged" intensity and/or energy may be considered to comprise minor variations for instance maximum 0.1%, 0.5%, or 5%. Alternatively, it could be that a control signal indicative of intensity and/or energy of the electron beam transmitted to the electron beam source is kept constant so that any variation arises from the drift, or similar, in the set-up, or is due to statistical or random fluctuations.

In the context of the present invention, it is to be understood that the term "immediately before" should be considered in relation to the scale of the overlapping portions of the first and the second pattern, e.g. the so-called dot. Thus, the comparison should be made on length scale relevant of the dot dimension when considering the velocity of the electron beam travelling across the substrate. For instance, the velocity could correspond to a passage time (dot diameter divided by speed), the beam and/or energy being substantially constant on a scale of time comparable to the passage time, e.g. the beam and/or energy could be more or less constant on a scale of 3, 5, 10 or more times the passage of the dot.

In one embodiment, the intensity and/or energy of the electron beam may further be substantially unchanged on a length scale significantly larger the overlapping portions of the first and the second patterns (P1, P2). For instance the overlapping portions of the first and the second patterns (P1, P2) could be characterised by the diameter of the resulting dots, and the length scale of change could be at least 3, 5 or 10 times more than the diameter of the dots. By the term "length scale", it is understood that the intensity and/or energy of the electron beam changes e.g. by maximum 0.1%, 0.5%, or 5% on that length scale. Alternatively, it could be that a control signal indicative of intensity and/or energy of the electron beam transmitted to the electron beam source is kept constant so that any variation arises from the drift, or similar, in the set-up, or is due to statistical or random fluctuations.

The key point of the invention is that the electron beam source does not need addressing each dot to be formed individually.

In some embodiments, this may be equivalent to the characteristic that the electron beam, when forming the first or the second pattern, has a substantially constant velocity across the substrate at least when forming the overlapping portions of the first and second patterns. Thus, the velocity vector (speed and direction) is unchanged i.e. having a zero acceleration vector.

In one alternative embodiment, the electron beam during passage of an overlapping portion of the first and the second patterns (P1, P2) further may have a substantially unchanged intensity and/or energy, as compared to the beam intensity and/or the energy of the electron beam immediately after the said passage, i.e. instead of before the passage.

In some embodiment, the electron beam during forming of the first and/or second pattern (P1, P2) on the substrate may have a substantially constant intensity and/or energy.

In other embodiments, the electron beam source may be capable of providing one electron beam, preferably just one, the first and the second pattern being consecutively formed with the said one electron beam.

Preferably, the mutually overlapping portions of the first and second patterns may define a two-dimensional array of dots, and more preferably the two-dimensional array of dots may be periodic in one or more directions with one or more periods. The said dots may have a maximum dimension of 0.1, 1, 2, 5, 10, 20, 30, 40, 50, 60, 70, 80, 90, 100, 1,000, or 10,000 nanometer.

In one embodiment, wherein the first and/or the second pattern (P1, P2) are/is a plurality of parallel lines, the direction (D1, D2) of the first and/or second patterns is defined by the direction of the lines. Specifically, the first and second pattern (P1, P2) may be approximately 90 degrees shifted relative to each other. Alternatively, an additional third pattern (P3) with a third direction (D3) may be formed on the substrate, the first, the second, and third direction being shifted approximately 60 degrees relative to each other for forming a hexagonal pattern.

The resolution of the electron beam source (EBS) may typically be at least 0.1, 1, 2, 5, 10, 20, 30, 40, 50, 60, 70, 80, 90, 100, 1000, or 10,000 nanometer.

In a second aspect, the invention relates to an electron beam lithography (EBL) apparatus, the apparatus comprising an electron beam source (EBS) capable of emitting an electron beam, the apparatus being arranged for performing lithography on an associated substrate with an energy sensitive resist on a surface of the substrate, the resist having a threshold dose/energy, by relatively displacing the electron beam across the substrate a first plurality of times so as to form a first pattern (P1) on the substrate, the first pattern defining a first direction (D1) on the substrate, and relatively displacing the electron beam across the substrate a second plurality of times so as to form a second pattern (P2) on the substrate, the second pattern defining a second direction (D2) on the substrate, the second direction (D2) being non-parallel to the first direction (D1), wherein the energy and/or dose delivered to the energy sensitive resist during the exposure of the first and the second pattern is dimensioned so that the said threshold dose/energy of the energy sensitive resist is reached on the overlapping portions of the first and the second patterns (P1, P2), and wherein the electron beam during passage of an overlapping portion of the first and the second patterns (P1, P2) has a substantially unchanged beam intensity and/or energy, as compared to the beam intensity and/or the energy of the electron beam immediately before the said passage.

In a third aspect, the invention relates to a computer program product being adapted to enable a computer system comprising at least one computer having data storage means associated therewith to control an electron beam lithography device according to the first aspect of the invention.

This aspect of the invention is particularly, but not exclusively, advantageous in that the present invention may be implemented by a computer program product enabling a computer system to perform the operations of the second aspect of the invention. Thus, it is contemplated that some known electron beam lithography device may be changed to operate according to the present invention by installing a computer program product on a computer system controlling the said optical recording apparatus. Such a computer program product may be provided on any kind of computer-readable medium, e.g. a magnetically or optically based medium, or through a computer-based network, e.g. the Internet.

The described invention may also be applicable in optical solutions, like but not limited to laser writing/lithography where the time spent on addressing each element is the most time consuming factor of the process.

The first, second and third aspect of the present invention may each be combined with any of the other aspects. These and other aspects of the invention will be apparent from and elucidated with reference to the embodiments described hereinafter.

BRIEF DESCRIPTION OF THE FIGURES

The present invention will now be explained, by way of example only, with reference to the accompanying Figures, where.

DETAILED DESCRIPTION OF AN EMBODIMENT

Figure 1:
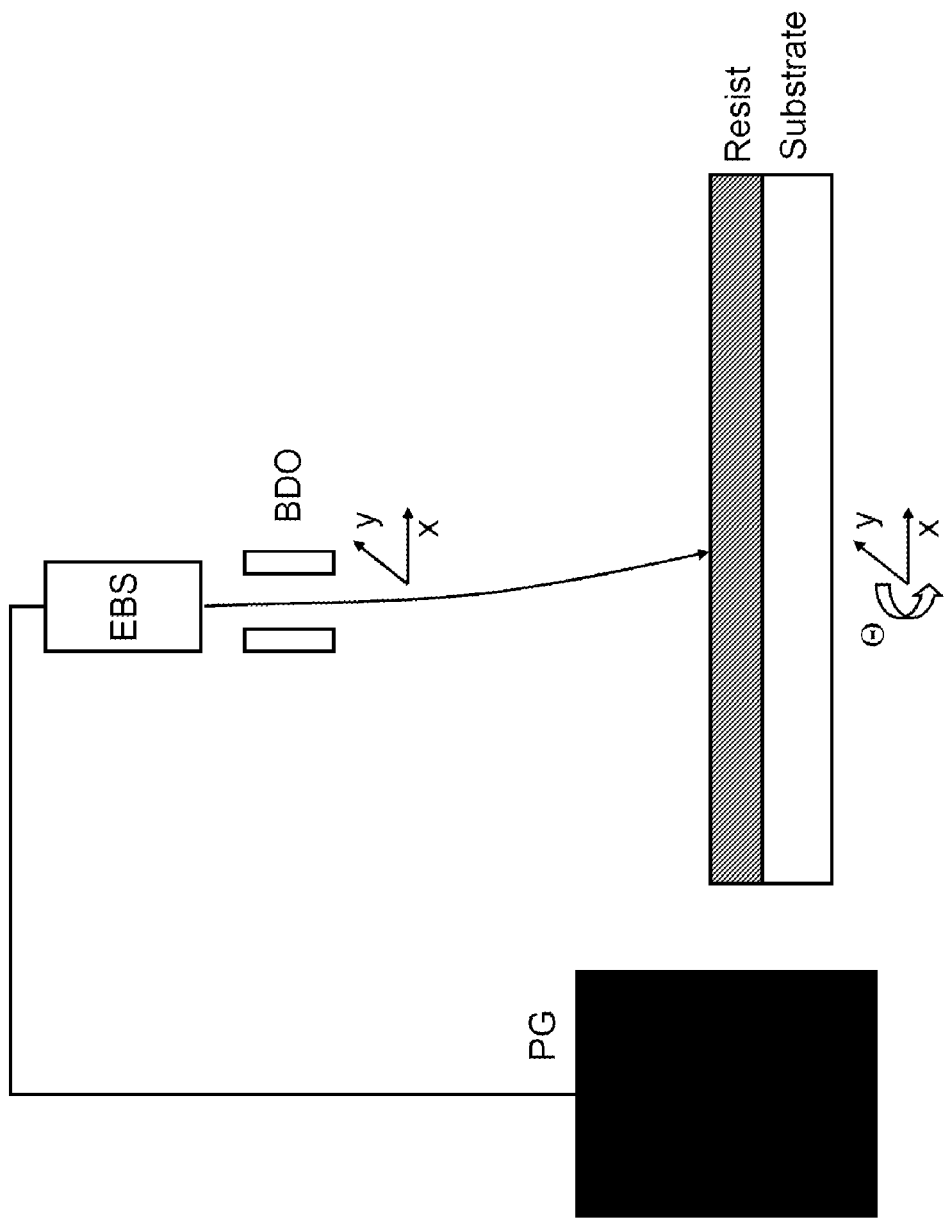
FIG. 1 is a schematic drawing of an electron beam source over a substrate with an energy sensitive resist.

FIG. 1 is a schematic drawing of an electron beam source over a substrate with an energy sensitive resist.
Annotations used in FIG. 1:
PG: Pattern Generator
EBS: Electron beam source
BDO: Beam deflection optics The electron beam moves relative to the substrate, either by moving the beam, moving the substrate or both simultaneously.

In order to perform electron beam lithography (EBL), there is provided a substrate with an energy sensitive resist with a threshold dose/energy, also known as clearing dose, saturation dose/energy, on a surface of the substrate.

Additionally, an electron beam source (EBS) with beam deflecting optics (BDO) is provided so that the EBS is capable of emitting an electron beam towards the energy sensitive resist, preferably with a nano-meter scale precision.

Next, there is performed a relative displacement of the electron beam across the substrate a first plurality of times so as to form a first pattern (P1) on the substrate, the first pattern defining a first direction (D1) on the substrate.

Subsequently, there is also performed a relative displacement of the electron beam across the substrate a second plurality of times so as to form a second pattern (P2) on the substrate, the second pattern defining a second direction (D2) on the substrate, the second direction (D2) being non-parallel to the first direction (D1).

The energy and/or dose delivered to the energy sensitive resist during the exposure of the first and the second pattern is dimensioned so that the threshold dose/energy of the energy sensitive resist is reached on the overlapping portions of the first and the second patterns (P1, P2).

For an electron beam system run in the prior art way, it takes a finite time (today in the order of $\mu s$/microseconds) to address each element in the exposed pattern. Thus, for a square array of dots or holes (elements), the time spent on addressing each element scales with $N^2$ where N is the number of dots on each side of the patterned array. When this pattern is written with the present invention, the number of elements that has to be addressed is only $2*N$—so the amount of time spent on addressing in an exposure is reduced with a factor of N/2.

The lower limit for the size of dot arrays that is usable is in the range of 1 cm×1 cm and the upper limit is in the order of 1 m×1 m.

In these cases the factor becomes, for 50 nm half-pitch (100 nm period) square arrays:
1 cm×1 cm: $(N=10^5)0.5*10^5$
1 m×1 m: $(N=10^7)0.5*10^7$
Thus, if the time spent for addressing each element is 1 $\mu s$ the dead time is reduced from X to Y:
1 cm×1 cm: from $X=10^4$ s to $Y=0.2$ s
1 m×1 m: from $X=10^8$ s to $Y=20$ s
The number of lines written in a pattern with the present invention may preferably be any number between 1000 and $10^9$; $10^n$; n being 3, 4, 5, 6, 7, 8, or 9.
Some examples for the number of dots/holes may be:
Lower limit 2" square area 50 nm half-pitch (100 nm period): $25*10^{10}$
3" square area 50 nm half-pitch (100 nm period): $56*10^{10}$
4" square area 50 nm half-pitch (100 nm period): $10^{12}$
6" square area 50 nm half-pitch (100 nm period): $2*10^{12}$
Upper limit 20" square area 50 nm half-pitch (100 nm period): $25*10^{12}$, and
Very upper limit 2 m×2 mm square area 5 nm half-pitch (10 nm period): $4*10^{16}$
Thus, a significant amount of time may be saved with the present invention, particularly when a large number of dots is to be exposed.

The invention can be used with the following resist, but not limited to those resists: ZEP520, SU-8, ma-N 2401×P, mr-L 6000×P, TEBN-1, HSQ, PMMA, PS (poly styrene), SAL, etc.

The invention is not limited to single beam systems but can also be applied to multiple electron beam systems where 2 or more EBS expose in parallel.

Typical threshold dose/energy (clearing dose or saturation dose/energy) for electron sensitive resists are in the range of 20 $\mu C/cm^2$ to 5 $mC/cm^2$.

For instance the threshold dose/energy of PMMA at 30 kV acceleration voltage is ~200 μC/cm^2. Thus, for a dot/hole array formed by the crossings of two lines each line would be exposed with a dose/energy of 100 μC/cm^2. For an array formed by the crossings of 3 lines each line would be exposed with a dose/energy of 200/3~67 μC/cm^2.

The control of the exposure dose/energy is only critical where the lines cross to form the dot/hole. Thus, one could modulate the dose/energy of the lines in-between the crossings, or mutually overlapping portions of the first and second patterns, if one finds this applicable—as long as the dose/energy between crossings does not exceed the threshold dose/energy (clearing dose or saturation dose/energy) for the resist.

Figure 2:
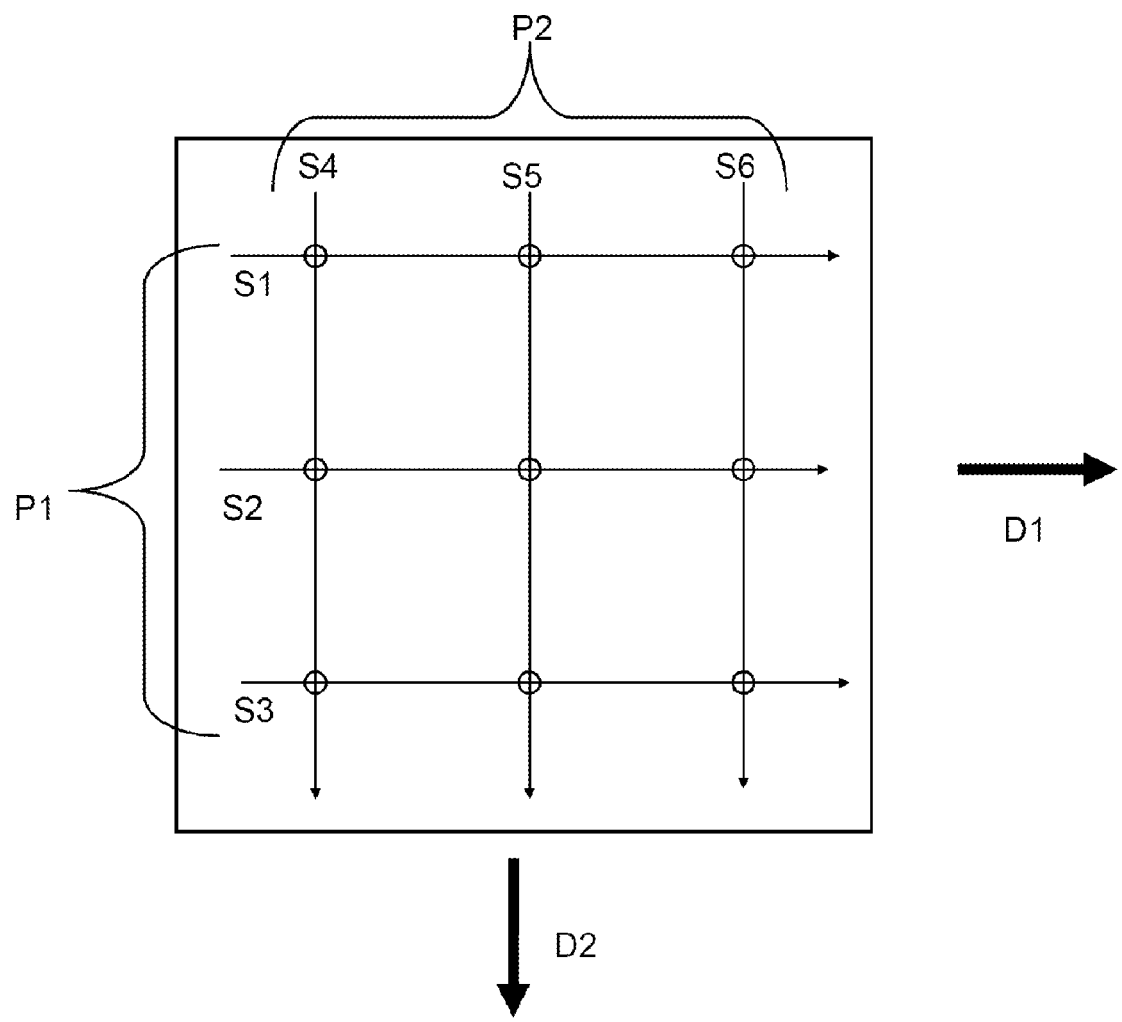
FIG. 2 is a schematic drawing of a first and a second pattern according to the present invention.

FIG. 2 is a schematic drawing of a first P1 and a second pattern P2 according to the present invention, showing, from a top view, the directions D1 and D2 associated with the first and the second patterns, respectively. In this and the following embodiments, the patterns are formed by parallel lines. However, the present invention may also be applied for other patterns.

The shape of the dots/holes formed by the mutually overlapping regions of the first and the second patterns are not necessarily round. They could also be but not limited to square, parallelogram or triangular.

Figure 3:
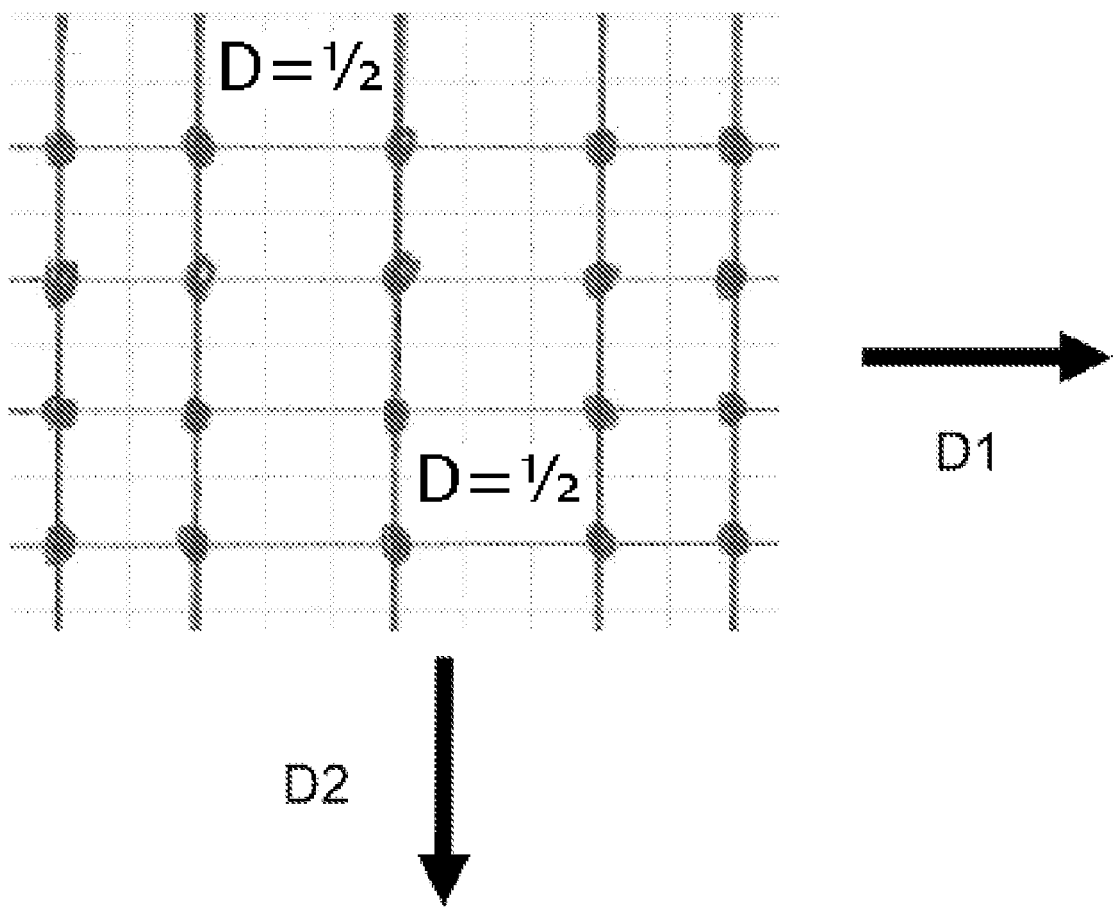
FIG. 3 is similar to FIG. 2 showing more lines in the first and second patterns.

FIG. 3 is similar to FIG. 2 showing more lines in the first and second patterns. Instead of addressing each hole or dot (element) separately, this invention proposes a technique (writing strategy) to fabricate the hole or dot arrays by exposing line grids with different periods and turned any given angle relative to each other, in the Figure this angle is 90 degrees, —in the points where all lines cross, the dose is optimized to be equal to or higher than the clearing dose of the electron beam resist, whereas the dose in the other parts of each line is too low to completely expose the resist. Thus, after development one will end up having hole or dot arrays on the substrate. The figures below show examples where 2 or 3 line gratings result in different hole or dot arrays; hexagonal, square and more random rectangular.

Square hole or dot arrays are fabricated by 2 line gratings with the same period rotated 90 deg relative to each other. Each line is exposed with ½ of the clearing dose of the resist so that only the spot where both lines cross the resist is fully exposed. This is indicated as D=½ in the Figure.

More random rectangular arrays are also possible. The position of each line is different from the square array. Besides this, the mechanism to form the hole or dot array is the same. This illustrates that a lot of different holes or dot arrays with many different geometries can be made with this technique.

Figure 4:
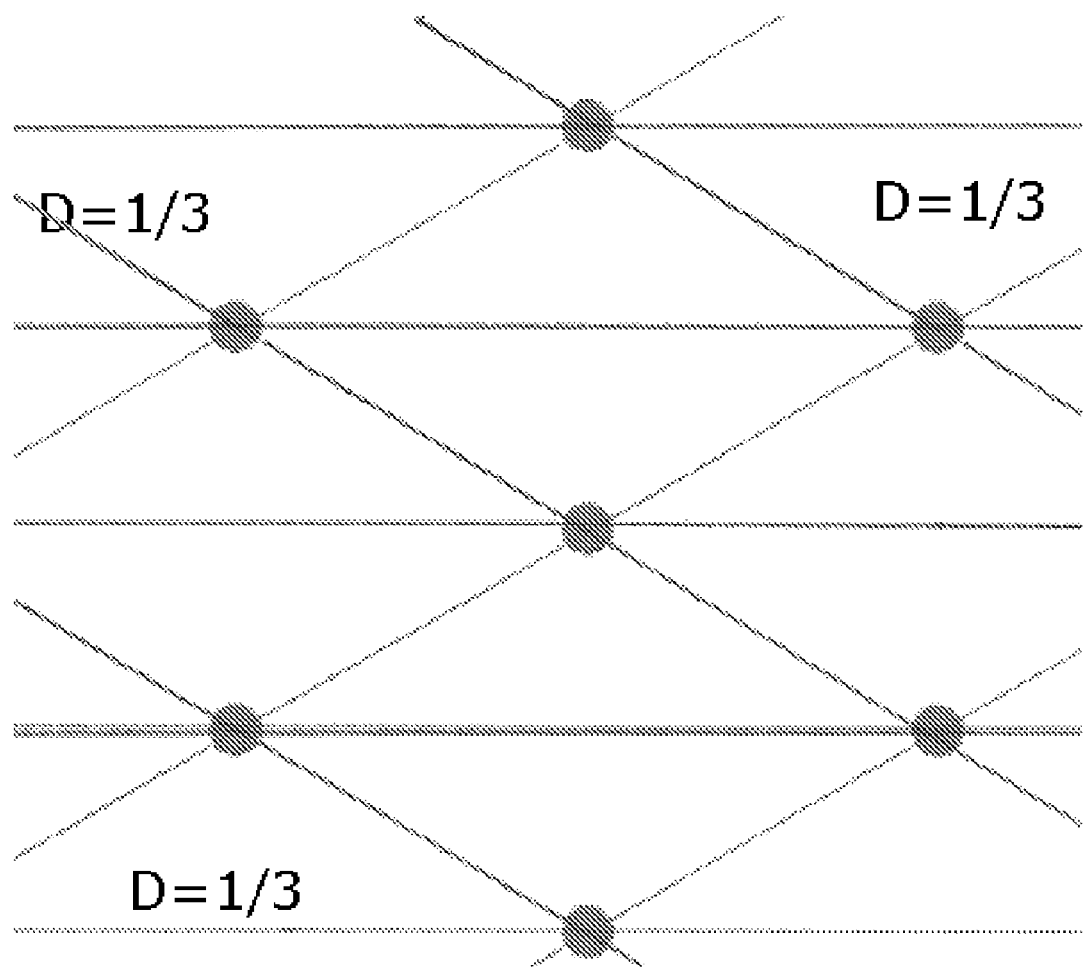
FIG. 4 is similar to FIG. 2 showing a first, a second pattern and a third pattern according to the present invention.

FIG. 4 is similar to FIG. 2 showing a first, a second pattern and a third pattern according to the present invention. A hexagonal hole or dot array is exposed by 3 line gratings. Each line is exposed with ⅓ of the clearing dose of the resist so that only in the spot where all 3 lines cross the resist will be fully exposed. This is indicated as D=⅓ in the Figure.

Figure 5:
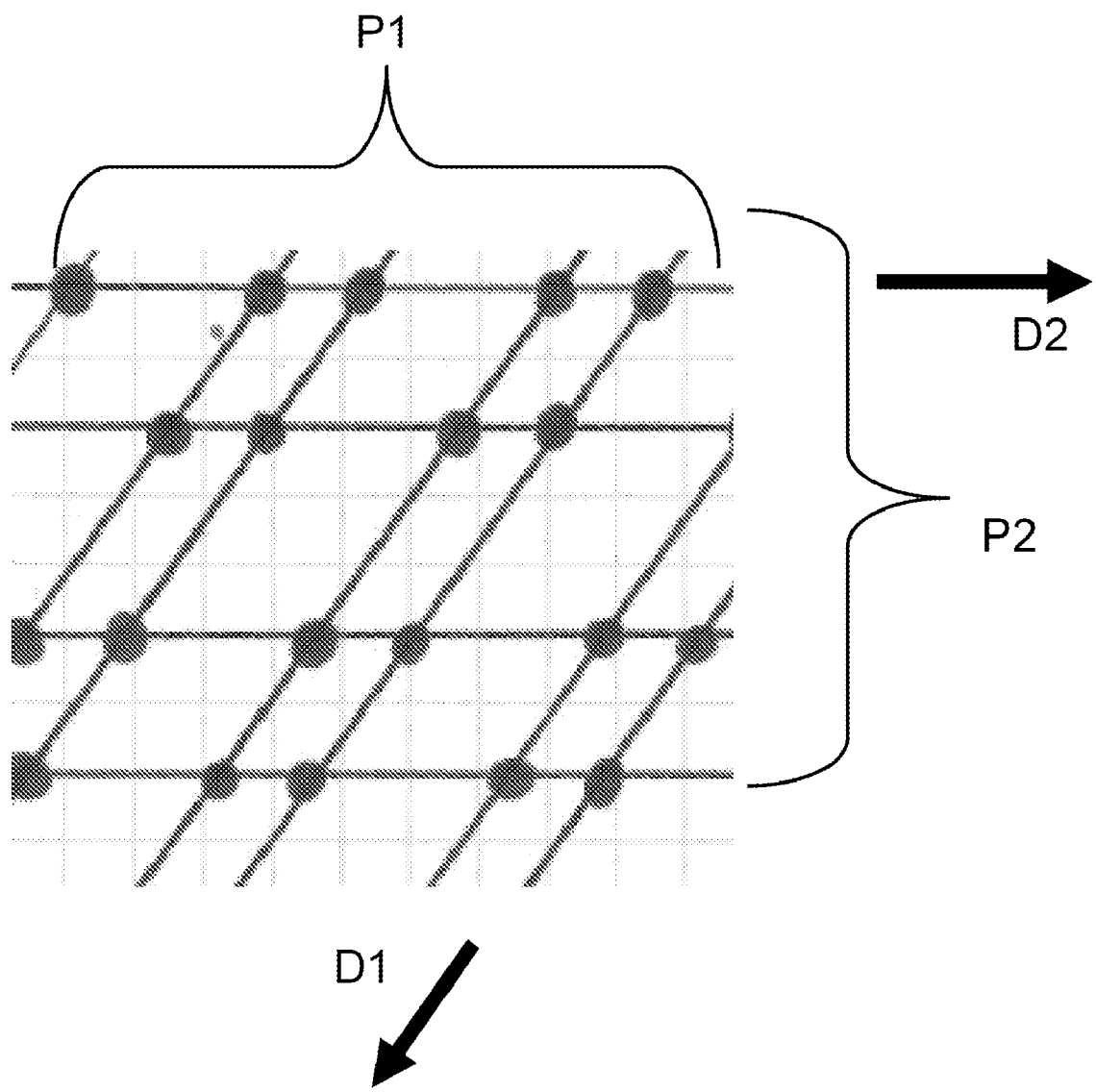
FIG. 5 is similar to FIG. 3 showing a first and a second pattern with a different geometry according to the present invention.

FIG. 5 is similar to FIG. 3 but with a different array geometry. The first pattern P1 has a direction D1 and the pattern P1 has two periods as seen in FIG. 5.

Figure 6:
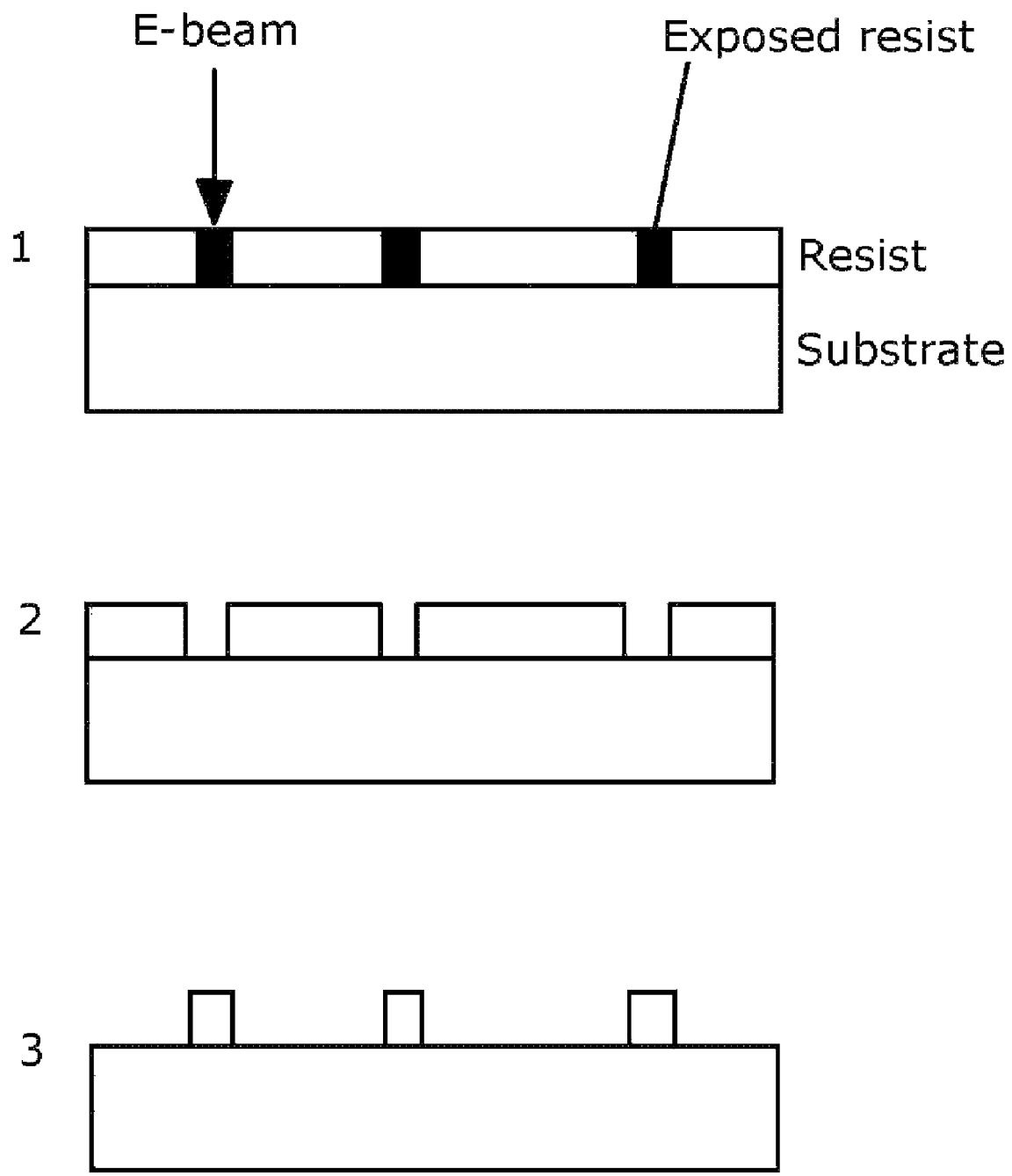
FIG. 6 is a schematic side-view of an electron beam lithography process.

FIG. 6 is a schematic side-view of an electron beam lithography process. An electron beam is used to write a pattern in an electron sensitive resist (1). The resist is developed resulting in holes where the resist has been exposed if it is a positive resist (2) or in dots if it is a negative resist (3).

Figure 7:
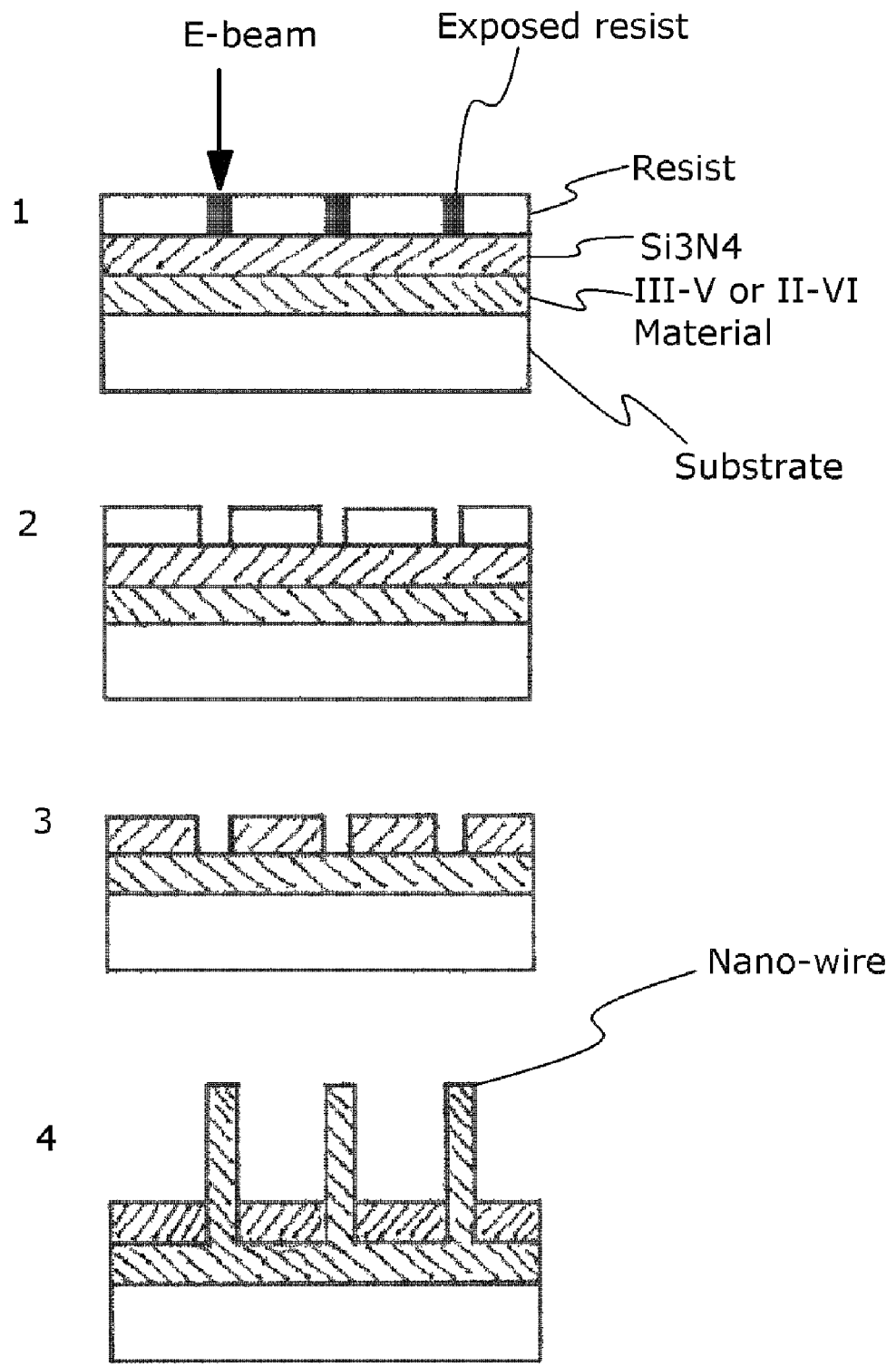
FIG. 7 is a schematic side-view of an electric beam lithography process for forming nano-wires.

FIG. 7 is a schematic side-view of an electric beam lithography process for forming nanowires.

In order to produce an LED based on GaAs and/or GaAlAs and/or GaInP and/or InP and/or other III-V and/or II-VI material combinations, high efficiency ensured by low surface recombination can be achieved by nano scale pillars/rods/whiskers. The pillars/rods/whiskers are grown from a thin film of the relevant material (III-V or II-VI) which is covered by a protection film/mask, e.g. but not limited to Si3N4, with holes so that only single crystalline pillars/rods/whiskers are grown from these because the holes are smaller than the typical grain size of the thin film material.

The invented and protected electron beam writing technique defines where the holes in the protection film are located. The invented technology ensures that the holes can be defined in a fast manner suitable for production by electron beam lithography.

Overview of the depicted fabrication process of nano pillars/rods/whiskers. A carrier substrate is covered with a thin film of any relevant III-V or II-VI material combination, and on top of this a protective film, e.g. but not limited to Si3N4, is applied and on top of this an electron sensitive resist which is patterned by the invented electron beam lithography technique (1). If a positive resist is used, the electron sensitive resist will after development (2) contain an array of well defined holes. The electron sensitive resist is used as an etch mask for wet or dry etching of the protective film to transfer the hole array to the protective film (3). The small holes through the protective film are used to grow single crystalline nanowires from (4).

Figure 8:
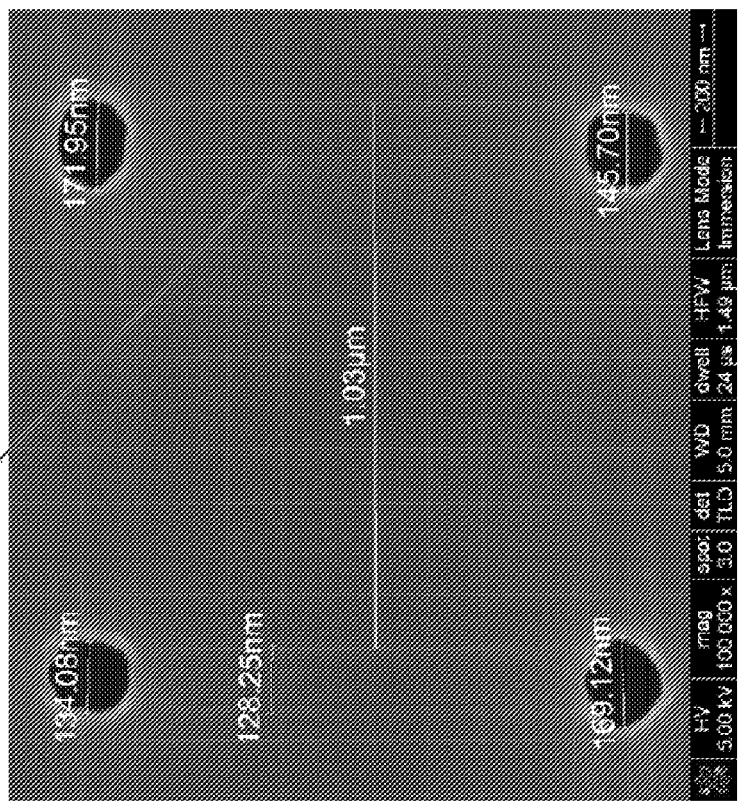
FIG. 8 is a SEM image of an orthogonal pattern according to the present invention.
Figure 8:
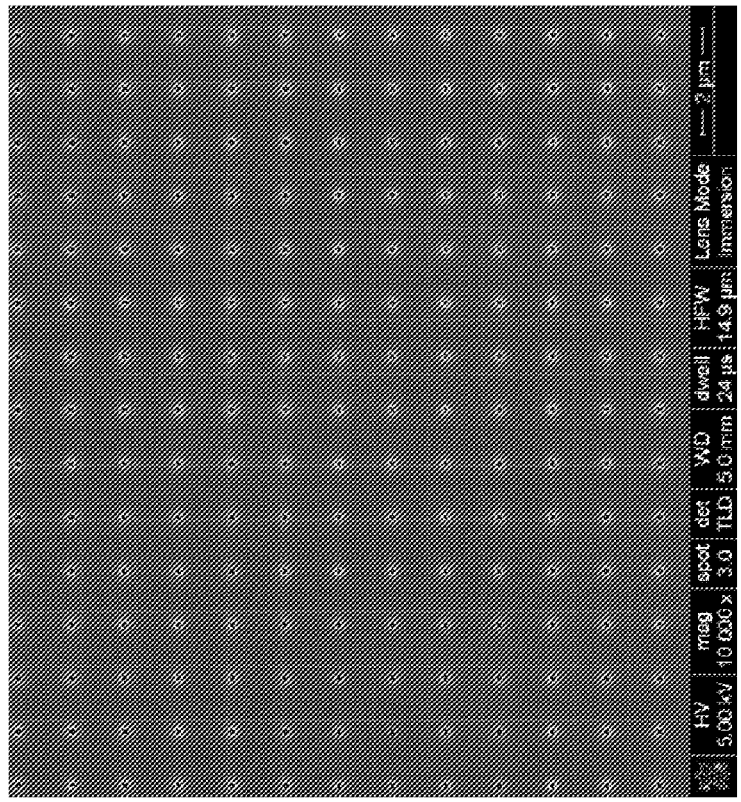

FIG. 8 is a SEM image of an orthogonal pattern made by double exposures of line gratings. The images were obtained before removing the resist.

The SEM image on the left shows the overall pattern, and the enlarged SEM image on the right shows the trace of the exposure (arrow) between the dots where the required dose/energy to has been reached. Also some scales of the dots and the distance are indicated.

Figure 9:
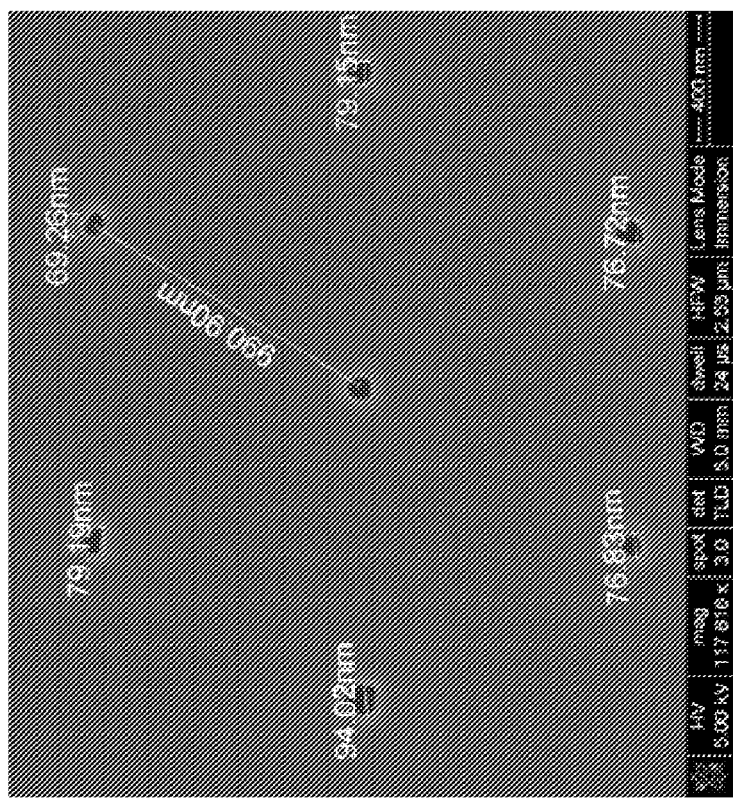
FIGS. 9 and 10 show SEM images of hexagonal patterns according to the present invention.
Figure 9:
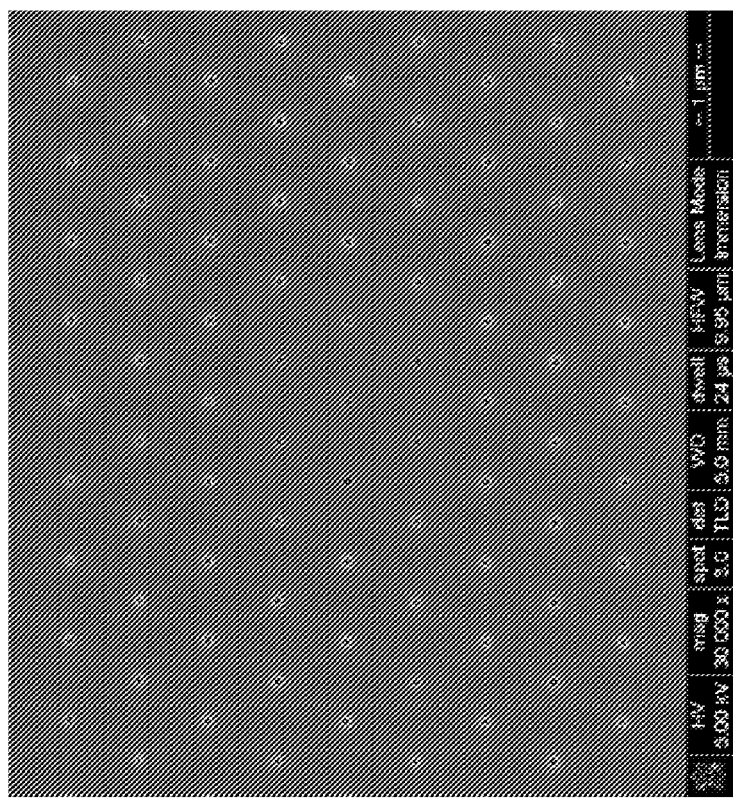

FIG. 9 show SEM images of patterns that are hexagonal but otherwise similar to FIG. 8. The images were obtained before removing the resist. The SEM image on the left shows the overall pattern. The enlarged SEM image on the right does not show trace of exposure because the dose was set to ⅓ of the required dose and thus no trace is left between the dots where the required dose/energy to has been reached (compared with FIG. 8). Also here some scales of the dots and the distance are indicated.

Figure 10:
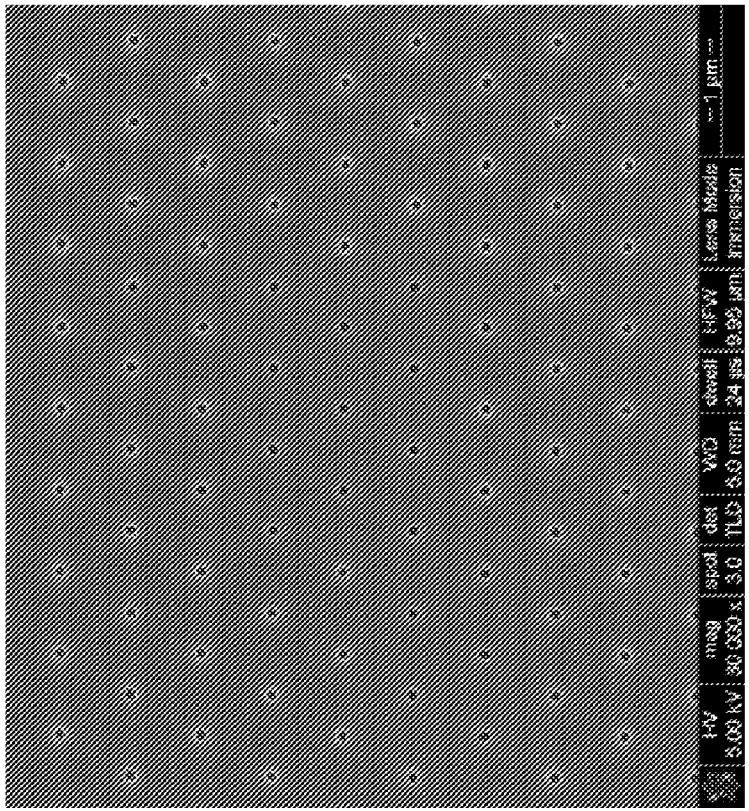
Figure 10:
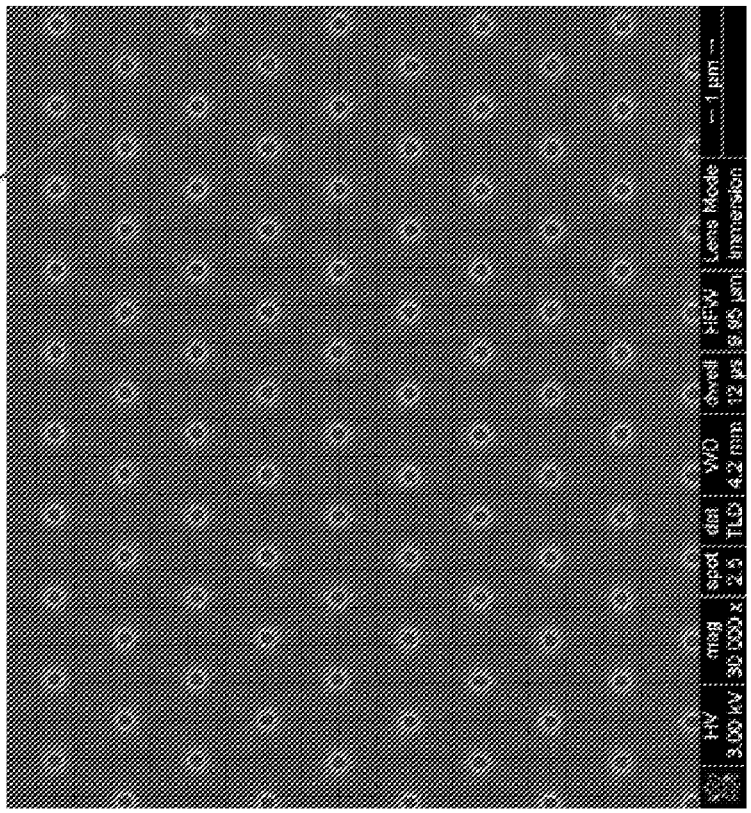

FIG. 10 left show SEM image of hexagonal patterns similar to FIG. 9 left but with a slightly larger dose in each exposure, and accordingly a trace of the exposure is seen (arrow). On the right, the holes transferred into the Si substrate are shown after removal of the resist. Notice that the exposure trace on the left SEM image is only a shallow effect in the resist, and accordingly the trace is not transferred to the Si during etching.

Figure 11:
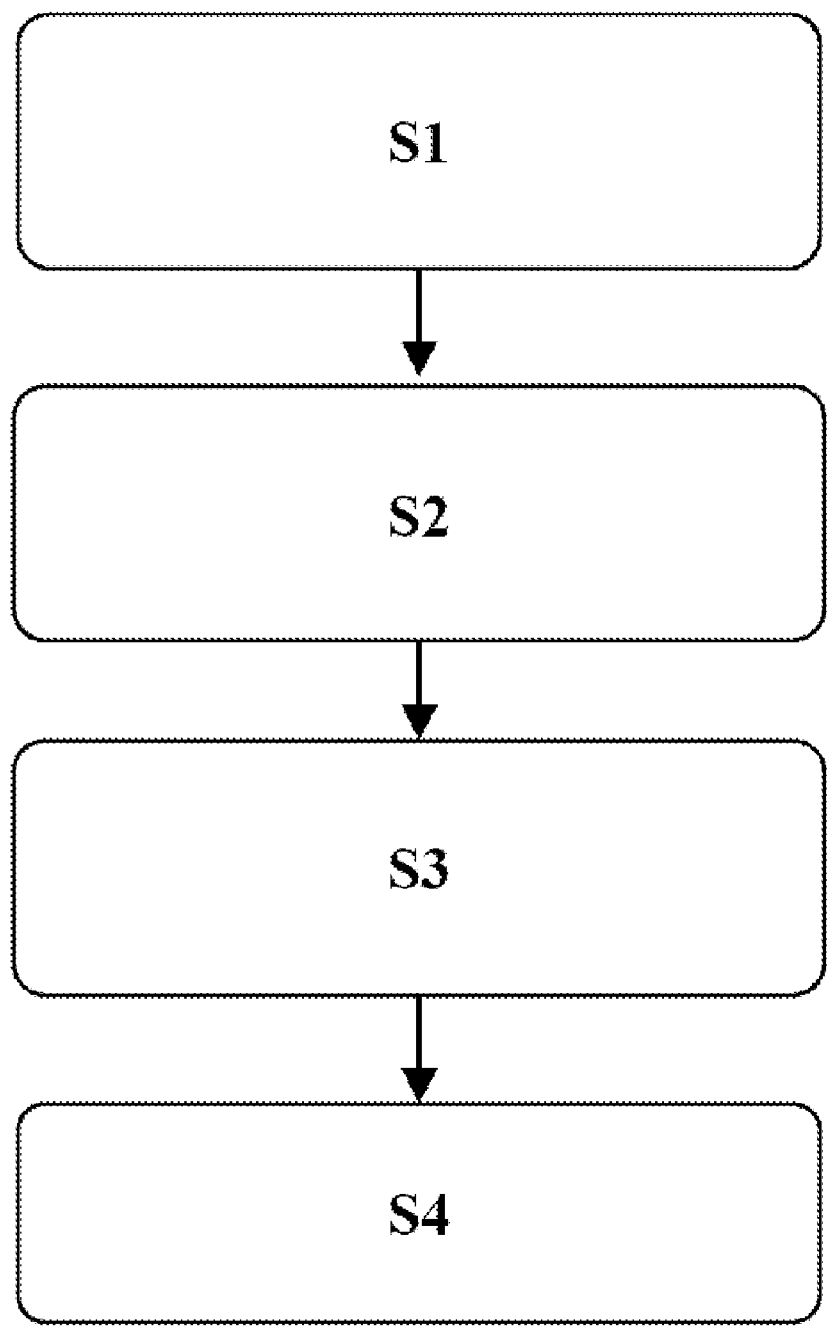
FIG. 11 is a flow chart of a method according to the invention.

FIG. 11 is a flow chart of a method according to the invention for performing electron beam lithography (EBL), the method comprising:

S1 providing a substrate with an energy sensitive resist with a threshold dose/energy on a surface of the substrate, S2 providing an electron beam source (EBS) capable of emitting an electron beam towards the energy sensitive resist, S3 relatively displacing the electron beam across the substrate a first plurality of times so as to form a first pattern (P1) on the substrate, the first pattern defining a first direction (D1) on the substrate, and S4 relatively displacing the electron beam across the substrate a second plurality of times so as to form a second pattern (P2) on the substrate, the second pattern defining a second direction (D2) on the substrate, the second direction (D2) being non-parallel to the first direction (D1), wherein the energy and/or dose delivered to the energy sensitive resist during the exposure of the first and the second pattern is dimensioned so that the said threshold dose/energy of the energy sensitive resist is reached on the overlapping portions of the first and the second patterns (P1, P2), and wherein the electron beam during passage of an overlapping portion of the first and the second patterns (P1, P2) has a substantially unchanged beam intensity and/or energy, as compared to the beam intensity and/or the energy of the electron beam immediately before the said passage.

The invention can be implemented in any suitable form including hardware, software, firmware or any combination of these. The invention or some features of the invention can be implemented as computer software running on one or more data processors and/or digital signal processors. The elements and components of an embodiment of the invention may be physically, functionally and logically implemented in any suitable way. Indeed, the functionality may be implemented in a single unit, in a plurality of units or as part of other functional units. As such, the invention may be implemented in a single unit, or may be physically and functionally distributed between different units and processors.

Although the present invention has been described in connection with the specified embodiments, it is not intended to be limited to the specific form set forth herein. Rather, the scope of the present invention is limited only by the accompanying claims. In the claims, the term "comprising" does not exclude the presence of other elements or steps. Additionally, although individual features may be included in different claims, these may possibly be advantageously combined, and the inclusion in different claims does not imply that a combination of features is not feasible and/or advantageous. In addition, singular references do not exclude a plurality. Thus, references to "a", "an", "first", "second" etc. do not preclude a plurality. Furthermore, reference signs in the claims shall not be construed as limiting the scope.

The invention clamed is:

1. A method for performing electron beam lithography (EBL), the method comprising:
   providing a substrate with an energy sensitive resist on a surface of the substrate, the resist having a threshold dose/energy,
   providing an electron beam source (EBS) capable of emitting an electron beam towards the energy sensitive resist,
   relatively displacing the electron beam across the substrate a first plurality of times so as to form a first pattern (P1) on the substrate, the first pattern defining a first direction (D1) on the substrate,
   relatively displacing the electron beam across the substrate a second plurality of times so as to form a second pattern (P2) on the substrate, the second pattern defining a second direction (D2) on the substrate, the second direction (D2) being non-parallel to the first direction (D1),
   wherein the energy and/or dose delivered to the energy sensitive resist during the exposure of the first and the second pattern is dimensioned so that the said threshold dose/energy of the energy sensitive resist is reached on the overlapping portions of the first and the second patterns (P1, P2),
   wherein the electron beam during passage of an overlapping portion of the first and the second patterns (P1, P2) has a substantially unchanged beam intensity and/or energy, as compared to the beam intensity and/or the energy of the electron beam immediately before the said passage, and
   wherein the first and/or the second pattern (P1, P2) are/is a plurality of parallel lines, the direction (D1, D2) of the first and/or second patterns being defined by the direction of the lines.

2. A method according to claim 1, wherein the intensity and/or energy of the electron beam is further substantially unchanged on a length scale significantly larger the overlapping portions of the first and the second patterns (P1, P2).

3. A method according to claim 1, wherein the electron beam, when forming the first or the second pattern, has a substantially constant velocity across the substrate at least when forming the overlapping portions of the first and second patterns.

4. A method according to claim 1, wherein the electron beam during forming of the first and/or second pattern (P1, P2) on the substrate has a substantially constant intensity and/or energy.

5. A method according to claim 1, wherein the electron beam source is capable of providing one electron beam, the first and the second pattern being consecutively formed with the said one electron beam.

6. A method according to claim 1, wherein the mutually overlapping portions of the first and second patterns define a two-dimensional array of dots.

7. A method according to claim 6, wherein the two-dimensional array of dots is periodic in one or more directions with one or more periods.

8. A method according to claim 5, wherein the dots have a maximum dimension of 0.1, 1, 2, 5, 10, 20, 30, 40, 50, 60, 70, 80, 90, 100, 1,000, or 10,000 nanometer.

9. A method according to claim 1, wherein the first and second pattern (P1, P2) is approximately 90 degrees shifted relative to each other.

10. A method according to claim 1, wherein an additional third pattern (P3) with a third direction (D3) is formed on the substrate, the first, the second, and third direction being shifted approximately 60 degrees relative to each other.

11. A method according to claim 1, wherein the resolution of the electron beam source (EBS) is at least 0.1, 1, 2, 5, 10, 20, 30, 40, 50, 60, 70, 80, 90, 100, 1,000, or 10,000 nanometer.

12. A computer program product being adapted to enable a computer system comprising at least one computer having data storage means associated therewith to control an electron beam lithography device according to claim 1.

* * * * *